US006404697B1

United States Patent
Ryu et al.

(10) Patent No.: US 6,404,697 B1
(45) Date of Patent: Jun. 11, 2002

(54) DATA OUTPUT DEVICE FOR SYNCHRONOUS MEMORY DEVICE

(75) Inventors: Je-Hun Ryu; Jung-Won Suh, both of Ichon-shi (KR)

(73) Assignee: Hyundai Electronics Industries (KR)

( * ) Notice: Subject to any disclaimer, the term of this patent is extended or adjusted under 35 U.S.C. 154(b) by 0 days.

(21) Appl. No.: 09/723,645

(22) Filed: Nov. 27, 2000

(30) Foreign Application Priority Data

Nov. 26, 1999 (KR) .............................. 99-52858

(51) Int. Cl.[7] .................................. G11C 8/00
(52) U.S. Cl. .............. 365/230.04; 365/233; 365/230.06
(58) Field of Search ............................ 365/233, 189.12, 365/230.04, 193, 230.02, 230.01, 230.03, 230.06, 230.08

(56) References Cited

U.S. PATENT DOCUMENTS

| | | | |
|---|---|---|---|
| 4,961,162 A | * 10/1990 | Nguyenphu et al. | 364/748 |
| 6,011,751 A | 1/2000 | Hirabayashi | 365/236 |
| 6,064,600 A | 5/2000 | Manning | 365/189.02 |
| 6,094,532 A | * 7/2000 | Acton et al. | 365/800.28 |
| 6,130,558 A | 10/2000 | Lee | 326/93 |
| 6,151,271 A | 11/2000 | Lee | 365/233 |
| 6,256,722 B1 | * 7/2001 | Acton et al. | 712/28 |
| 6,282,150 B1 | * 8/2001 | Edo | 365/233 |

OTHER PUBLICATIONS

B. Prince, "High Performance Memories," Wiley, 1996, p. 144.

* cited by examiner

Primary Examiner—David Nelms
Assistant Examiner—Thong Le
(74) Attorney, Agent, or Firm—Townsend and Townsend and Crew, LLP

(57) ABSTRACT

1. An apparatus for outputting data included in a synchronous memory device includes: first storage unit for storing in sequence even data provided by a first sense amplifier coupled to a selected even bank; second storage unit for storing odd data in sequence provided by a second sense amplifier coupled to a selected odd bank; selection unit coupled to the first storage unit and the second storage unit, for receiving at the same time both the even data and the odd data; third storage unit for storing and providing one of both the even data and the odd data in synchronization with a rising edge of a clock signal; fourth storage unit for storing and providing one of both the even data and the odd data in synchronization with a falling edge of a clock signal; data output unit for driving data from third storage unit and data from the fourth storage unit.

28 Claims, 9 Drawing Sheets

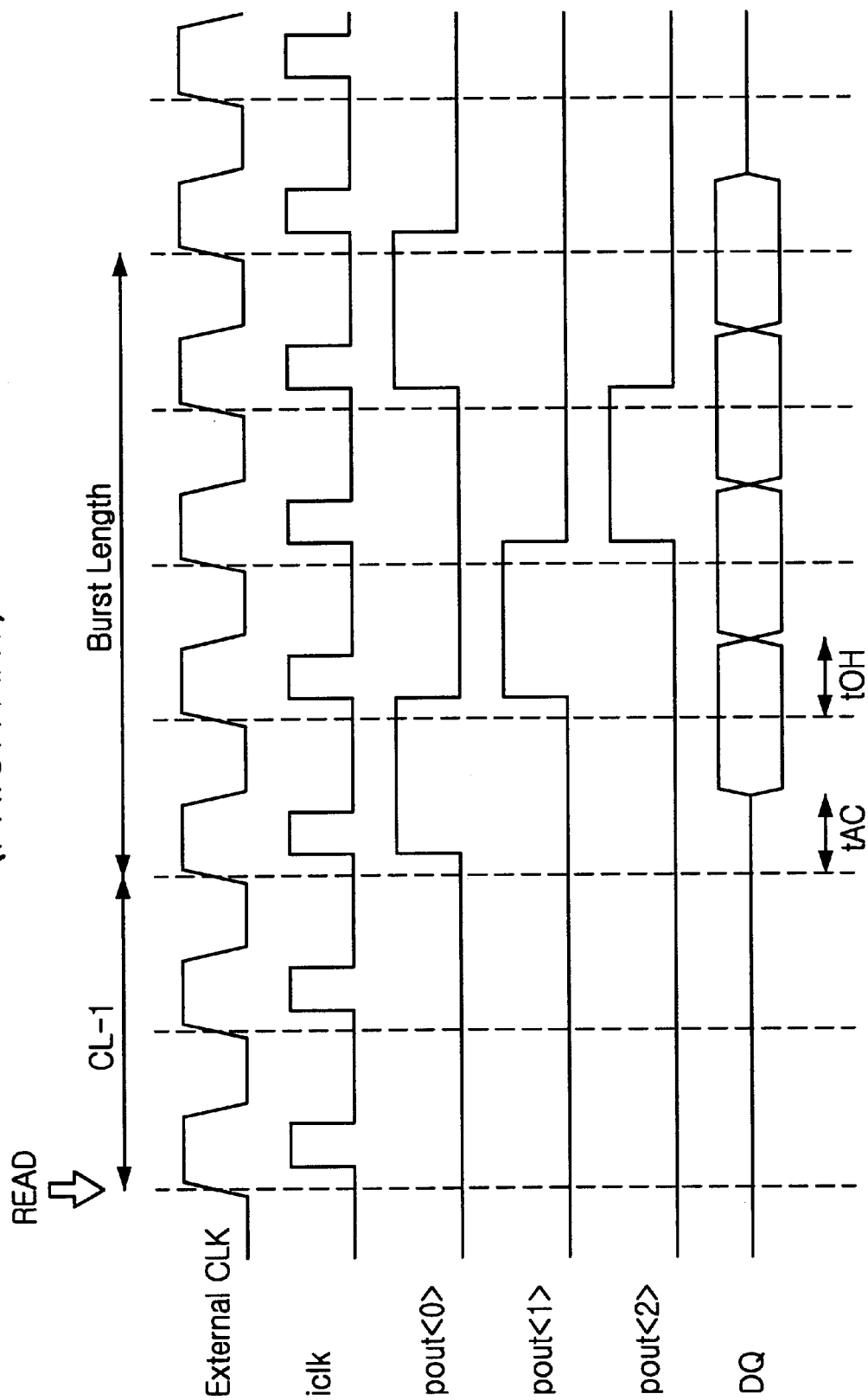

DATA OUTPUT DEVICE FOR SYNCHRONOUS MEMORY DEVICE

FIELD OF THE INVENTION

This invention relates to a data output device included in a double data rate (DDR) SDRAM; and more particularly, to a data output device included in a DDR SDRAM wherein data are outputted in synchronization with a rising edge and a falling edge of a clock signal

DESCRIPTION OF THE PRIOR ART

Generally, a conventional single data rate (SDR) synchronous memory device outputs data in synchronization with a rising edge of a clock signal. On the other hand, a double data rate (DDR) synchronous memory device outputs data in synchronization with the rising edge and a falling edge of the clock signal.

FIG. 1 is a block circuit diagram illustrating a synchronous memory device including a conventional data output device.

The synchronous memory device outputs data at a high speed, which a wave pipeline technique is applied to. In the wave pipeline technique, a plurality of registers are used. The wave pipeline technique is also applied to the DDR synchronous memory device wherein bandwidth can be significantly increased.

Referring to FIG. 1, a command decoder 120 receives command signal inputted to the memory device. The command decoder 120 generates corresponding signals by decoding the received command signal.

For example, when the command decoder 120 receives a read command signal 101 including a chip select signal (/CS), a row address strobe signal (/RAS), a column address strobe signal (/CAS) and a write enable signal (/WE), the command decoder 120 generates a read signal 122 and a bst_end signal 124. The read signal 122 contains information of "begin a read operation" and the bst_end signal 124 contains information of burst length.

The read signal 122 and the bst_end signal 124, together with a cas latency signal 132 from a mode register 130 and an internal clock (iclk) signal 112 from a clock buffer 110, are inputted to data output controlling unit 170, and in response, the data output control unit 170 generates one or more pipe input (pin) signals 180 and one or more pipe out (pout) signals 182. Here, the cas latency signal 132 is programmed in the mode register 130 and the iclk signal 112 is generated in the clock buffer 110. Each pin signal 180-0~180-n controls data to be inputted to each of a plurality of registers 190-0~190-n and each pout signal 192-0~182-n controls data signals to be outputted from each register.

(n+1) column address signals are inputted to (n+1) column address buffers 140 and then, internal column address signal (ca<0:n>) 142 is generated and outputted from the column address buffer 140. Upon a burst read operation, the ca<0:n> 142 is inputted to a burst column address counter 150, used as a start address signal.

The burst column address counter 150 transmits a column address to a column address decoder 160 in synchronization with the iclk signal 112 and the column address decoder 160 generates and outputs a signal (Yi) 165.

A bit line sense amplifier 210 is selected, based on the signal Yi 165. As a word line 211 is selected by a bank active command signal (not shown), data stored in a cell capacitor 214 are loaded on a bit line 212 and then sensed and amplified by the bit line sense amplifier 210.

The data amplified by the bit line sense amplifier 210, are loaded on a local input output line (local IO) and then sensed and amplified by input output (IO) sense amplifier 220. The data amplified by the IO sense amplifier 220 are loaded on a global input output line (global IO) 230.

Each of pipe input signals (pin<0:n>) 180-0~180-n outputted from the data output control unit 170 controls corresponding input switches 184-0~184-n that are coupled to each of registers 190-0~190-n in order to store the data loaded on the global IO 230 in each register sequently. Thus, if there are n registers, also there are needed n pipe input signals.

Each of pipe output signals (pout<0:n>) 182-0~182-n outputted from the data output control unit 170 controls corresponding output switches 186-0~186-n that are coupled to each of registers 190-0~190-n and an output driver 200. According to the output switch control, the data stored in each register are transmitted to the output driver 200 sequentially to thereby generate output data (DQ) 210. Thus, if there are n registers, also there are needed n pipe output signals.

FIG. 2 is a timing chart illustrating data output in a synchronous memory device shown in FIG. 1 wherein cas latency (CL)=3 and burst length=4.

The memory device receives an external clock (CLK) signal and then generates an internal clock (iclk) signal. A first pipe output signal (pout) is enabled, (CL-1) clock periods after the read command signal is inputted. Next pipe out signals are enabled sequently as long as the burst length.

Data are outputted under control of each pipe output signal, after a clock access time (tAC) from the (CL-1) clock periods after the read command signal is inputted. The outputted data are held during a output hold time (tOH).

As described above, data can be outputted at a high speed by applying the wave pipeline technique also to the DDR SDRAM. However, because the data can be outputted in synchronization with the rising edge and the falling edge of the clock signal in the DDR SDRAM wherein 2-bit prefetch mode is applied to, there is needed a newly-designed data output device in the DDR SDRAM in order to apply the 2-bit prefetch mode and the wave pipeline technique to the DDR SDRAM to thereby output the data at a higher speed.

SUMMARY OF THE INVENTION

It is an object of the present invention to provide an apparatus for outputting data included in a synchronous memory device to thereby operate the synchronous memory with stability at frequency higher than 200 MHz.

In accordance with an aspect of the present invention, there is provided an apparatus for outputting data included in a synchronous memory device, the apparatus including: first storage means for storing in sequence even data provided by a first sense amplifier coupled to a selected even bank; second storage means for storing odd data in sequence provided by a second sense amplifier coupled to a selected odd bank; selection means coupled to the first storage means and the second storage means, for receiving at the same time both the even data and the odd data; third storage means for storing and providing one of both the even data and the odd data in synchronization with a rising edge of a clock signal; fourth storage means for storing and providing one of both the even data and the odd data in synchronization with a falling edge of a clock signal; data output means for driving data from third storage means and data from the fourth storage means.

BRIEF DESCRIPTION OF THE DRAWINGS

Other objects and aspects of the invention will become apparent from the following description of the embodiments with reference to the accompanying drawings, in which:

FIG. 2 is a timing chart illustrating data output in a synchronous memory device wherein cas latency (CL)=3 and burst length=4;

DETAILED DESCRIPTION OF THE PREFERRED EMBODIMENTS

Figure 1:
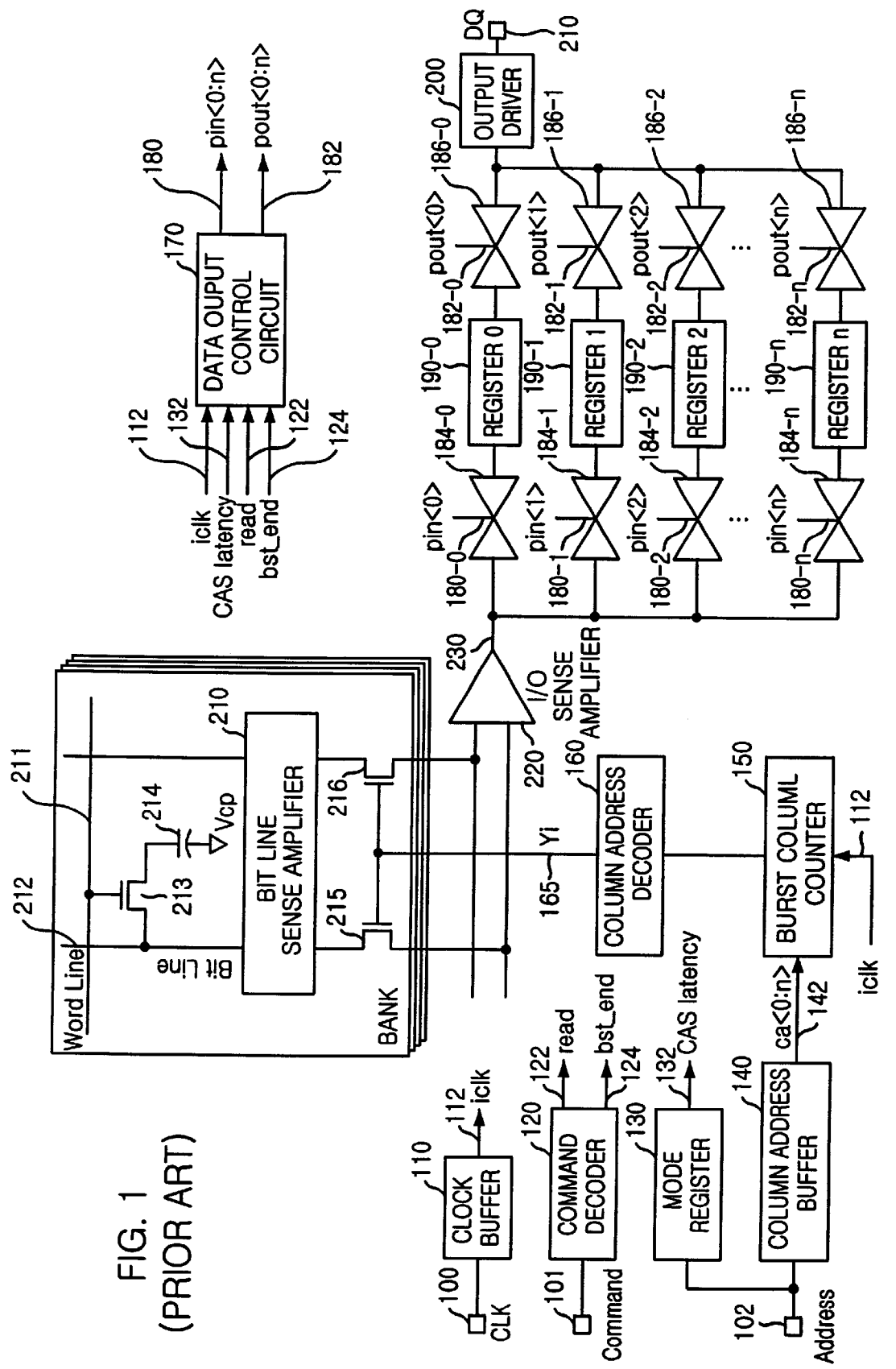
FIG. 1 is a block circuit diagram illustrating a synchronous memory device including a conventional data output device.
Figure 3A:
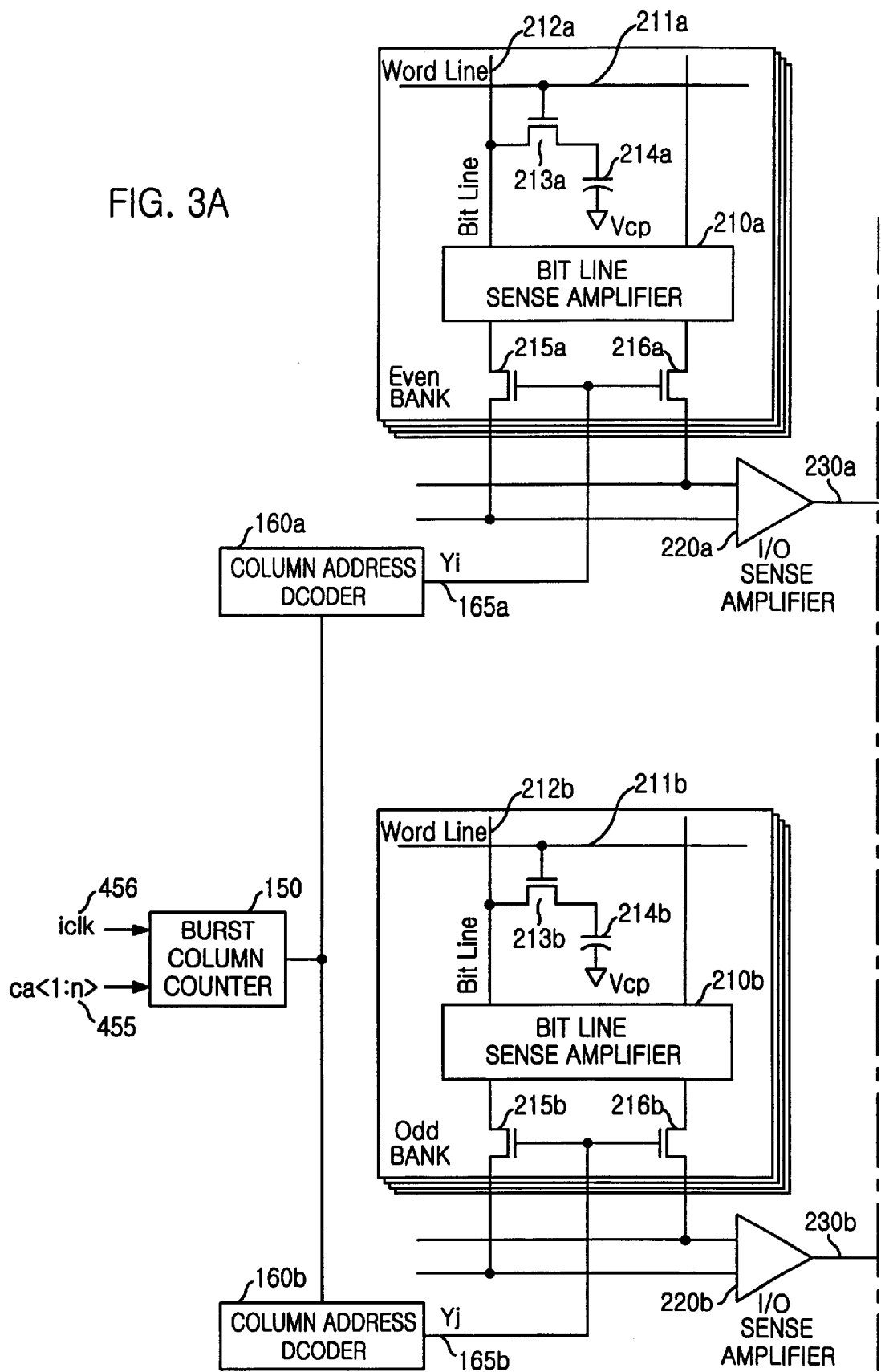
FIGS. 3A and 3B are circuit block diagrams showing a configuration of a DDR synchronous memory device including a data output device in accordance with the present invention.
Figure 3B:
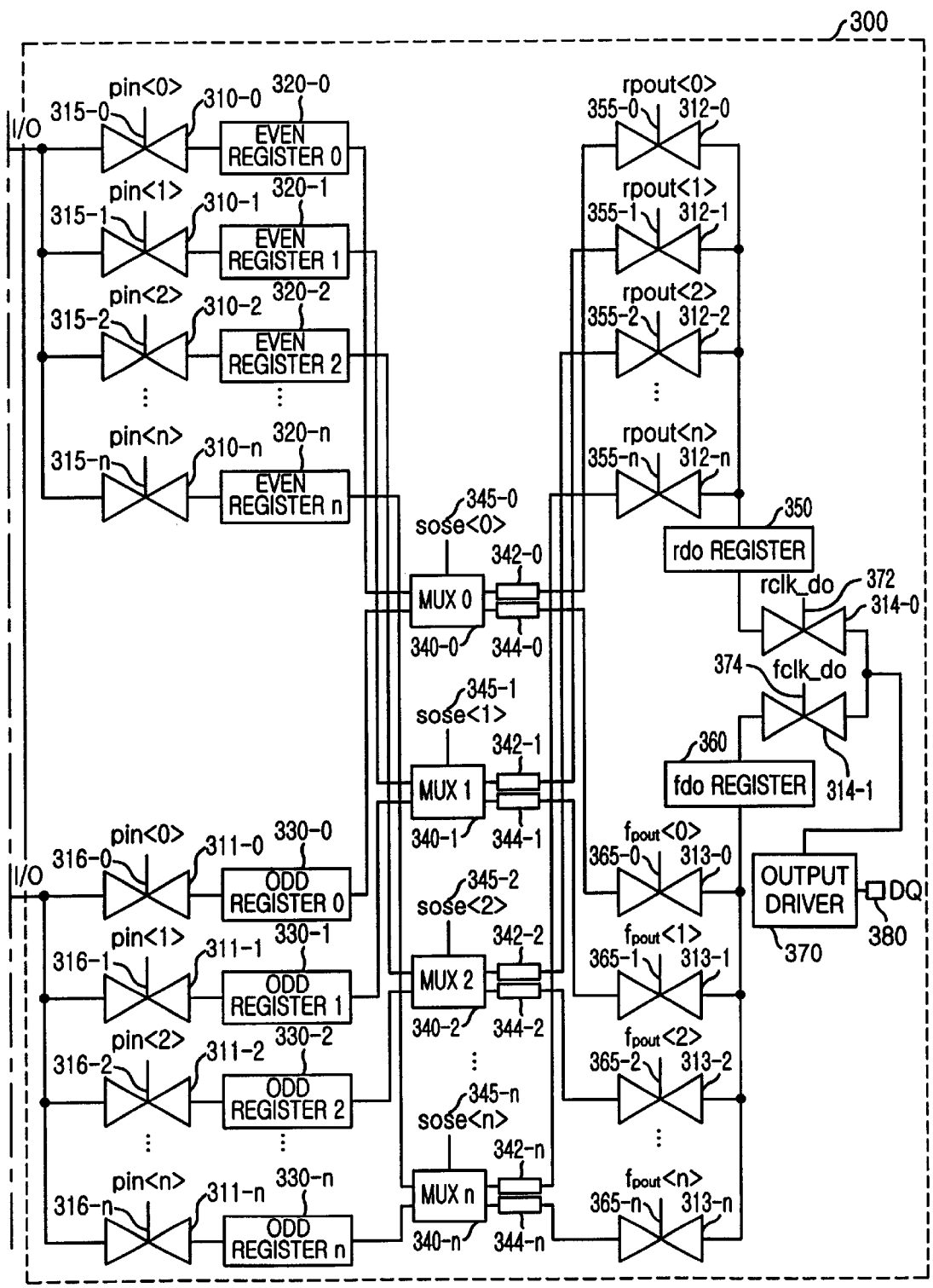

Generally, a synchronous memory device which a 2-bit prefetch mode is applied to, includes an even bank and an odd bank. Referring to FIGS. 3A and 3B in accordance with the present invention, in order to apply a wave pipeline technique to the above synchronous memory device, a data output device 300 that is included in the synchronous memory device includes a plurality of even registers 320-0~320-n, a plurality of odd registers 330-0~330-n, a plurality of multiplexers 340-0~340-n, a rdo register 350, a fdo register 360, an output driver 370 and a plurality of switching elements.

Even data from the even bank are stored in each even register, after being amplified in an input output (IO) sense amplifier 220a and also, odd data from the odd bank are stored in each odd register, after being amplified in another IO sense amplifier 220b.

Each even register 320-0~320-n receives and stores the even data loaded on an even global input output line (global IO) 230a via corresponding each switching device 310-0~310-n. Each switching device 310-0~310-n is operated in response to each of a plurality of pipe input signals 315-0~315-n.

In the same way, each odd register 330-0~330-n receives and stores the odd data loaded on an odd global input output line (global IO) 230b via corresponding each switching device 311-0~311-n. Each switching device 311-0~311-n is operated in response to each of a plurality of pipe input signals 316-0~316-n.

Figure 4:
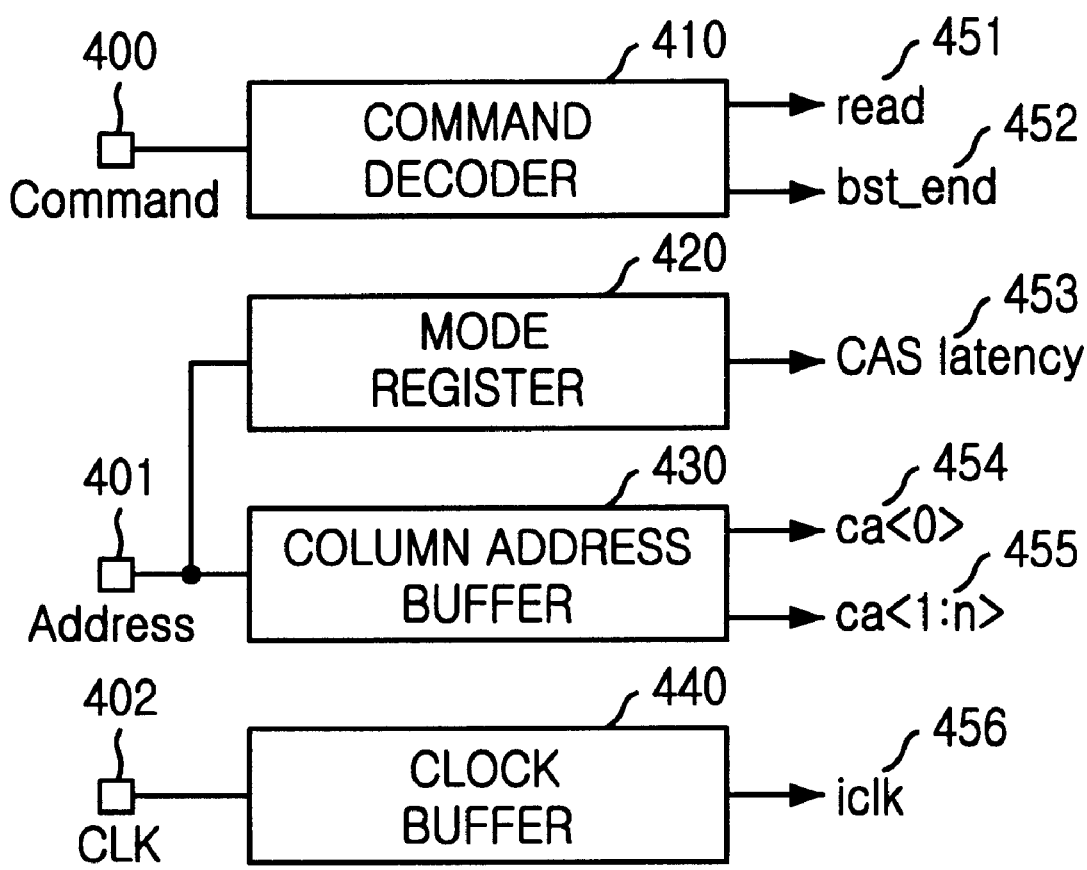
FIG. 4 is block diagram showing input/output flow of signals to/from a command decoder, a mode register, a column address buffer and a clock buffer that are included in a DDR synchronous memory device in accordance with the present invention.
Figure 5:
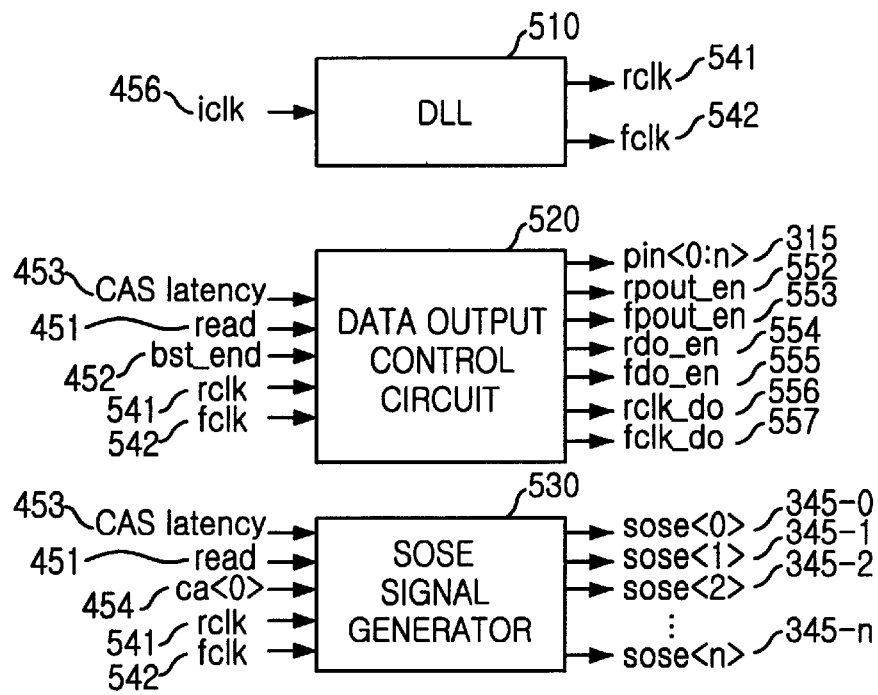
FIG. 5 is a block diagram showing input/output flow of signals to/from a DLL, a data output controller and a sose signal generator that are included in a DDR synchronous memory device in accordance with the present invention.

As shown in FIG.4 and FIG. 5, the pipe input signals 315 outputted from a data output control unit 520 are generated based on a cas latency signal 453, a read signal 451, a bst_end signal 452, a rclk signal 541 and a fclk signal 542 that are inputted to the data output control unit 520.

As aforementioned, the cas latency signal 453 is programmed in a mode register 420 and a read signal 451 and a bst_end signal 452 are generated and outputted by a command decoder 410 in response to a read command signal 400.

The rclk signal 541 and the fclk signal 542 are generated in synchronized with, respectively, a rising edge and a falling edge of an external clock signal (CLK) 402. The rclk 541 and fclk 542 signals are generated by a delay locked loop (DLL) 510 in response to an internal clock signal (iclk) 456 that is inputted to the DLL 510. As described above, the internal clock signal 456 is generated from a clock buffer 440 based on the external clock signal 402 inputted thereto.

Each of one or more multiplexers (MUX) 340-0~340-n receives the even data from each even register 320-0~320n and each odd register 330-0~330-n at the same time. Each MUX transmits the even data and the odd data/the odd data and the even data, respectively to the rdo register 350 and the fdo register 360 under control of sose signals 345-0~345-n correspondingly coupled to each MUX.

Figure 7:
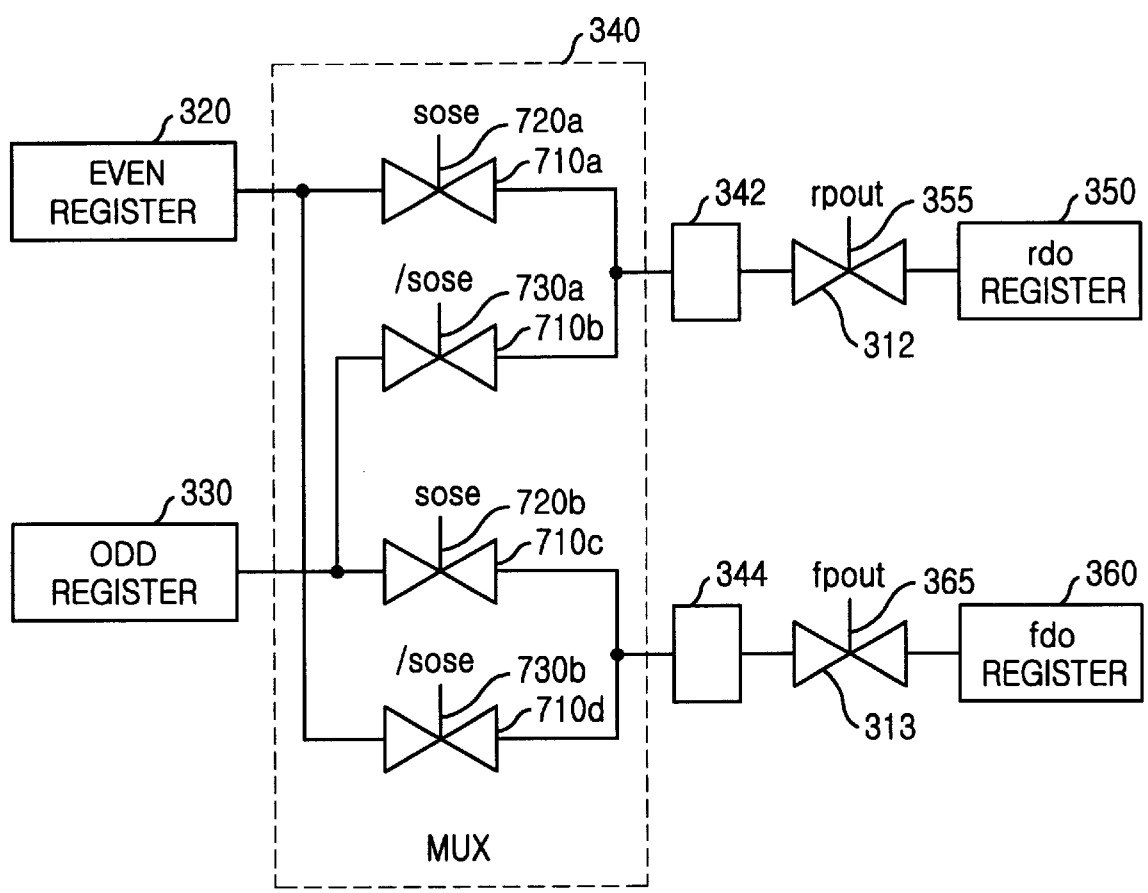
FIG. 7 is a circuit diagram showing a configuration of a multiplexer included in a DDR synchronous memory device in accordance with the present invention.

FIG. 7 is a circuit block diagram showing a configuration of the multiplexer (MUX).

As shown in FIG. 7, the MUX 340 includes 4 switching devices 710a, 710b, 710c and 710d, each of which is controlled by sose signals 720a and 720b and inverted sose signals (/sose) 730a and 730b.

The switching devices 710a and 710b are coupled to a first buffer 342 and the switching devices 710c and 710d are coupled to a second buffer 344. The first buffer 342 stores temporarily data to be supplied to the rdo register 350 and the second buffer 344 stores temporarily data to be supplied to the fdo register 360.

Input terminals of both the first and the fourth switching devices 710a and 710d are coupled to an output terminal of the even register, input terminals of both the second and the third switching devices 710b and 710c are coupled to an output terminal of the odd register. Output terminals of both the first and the second switching devices 710a and 710b coupled each other are coupled to an input terminal of the first buffer 342 and output terminals of both the third and the fourth switching devices 710c and 710d coupled each other are coupled to an input terminal of the second buffer 344.

In the above case, if the sose signals 720a and 720b are activated to thereby operate the first and the third switching devices 710a and 710c, the even data stored in the even register 320 are driven to the first buffer 342 and the odd data stored in the odd register 330 are driven to the second buffer 344.

On the other hand, if the inverted sose signals 730a and 730b are activated to thereby operate the second and the fourth switching devices 710b and 710d, the even data stored in the even register 320 are driven to the second buffer 344 and the odd data stored in the odd register 330 are driven to the first buffer 342.

Conclusively, depending on the sose signal, it is determined whether the even data is first outputted as a DQ via output driver, or the odd data.

The sose signals are generated by a sose signal generator 530. Referring to FIG. 4 and FIG. 5, the sose signal generator 530 receives a cas latency signal 453, a read signal 451, a ca<0> signal 454, the rclk signal 541 and the fclk signal 542 as input signals, which the sose signals 345-

0~345-n are generated based on. Here, the ca<0> signal 454 is a least significant bit (LSB) of internal column address ca<0:n> which is outputted from an column address buffer 430. It is determined whether a starting address is a start even (ca<0>="low") or a start odd (ca<0>="high") at data output time, based on the ca<0> 454. ca<1:n> signal 455 other than the ca<0> signal 454 that are outputted from the column address buffer 430, enables at the same time a Yi signal 165a toward an even bank and a Yj signal 165b toward an odd bank in synchronization with the internal clock (iclk) 456. Even and odd data signals that are amplified by each bit line sense amplifier 210a and 210b are loaded on each of local input output line (local IO) pair, in response to each of the Yi 165a and the Yj 165b signals. The even and odd data signals are amplified again by an input output (IO) sense amplifiers 220a and 220b and then loaded on each of an even global input output line (even global IO) 230a and an odd global input output line (odd global IO) 230b.

Even data and odd data that are stored respectively in each even register 320-0~320-n and odd register 330-0~330-n are transmitted to the rdo register 350 and the fdo register 360/ the fdo register 360 and the rdo register 350 under control of the sose signals 345-0~345-n, based on information included in the cas latency signal 453 and the ca<0> signal 454.

For example, if the cas latency=2 and the ca<0>="low", data stored in the even register are transmitted to the rdo register 350 and data stored in the odd register to the fdo register 360. On the other hand, if the cas latency=2 and the ca<0>="high", data stored in the even register are transmitted to the fdo register 360 and data stored in the odd register to the rdo register 350.

Also, if the cas latency=2.5 and the ca<0>="low", data stored in the even register are transmitted to the fdo register 360 and data stored in the odd register to the rdo register 350. On the other hand, if the cas latency=2.5 and the ca<0>="high", data stored in the even register are transmitted to the rdo register 350 and data stored in the odd register to the fdo register 360.

In this case, there are needed rpout signals and fpout signals in order to in sequence transmit data stored in a plurality of the even and odd registers to the rdo register and the fdo register in the same way as a synchronous memory to which the conventional wave pipeline technique is applied.

Figure 6:
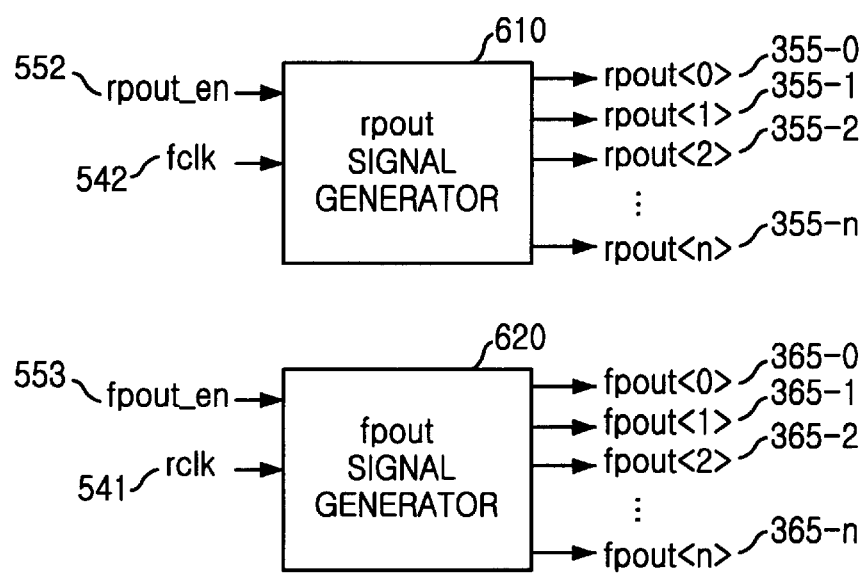
FIG. 6 is a block diagram showing input/output flow of signals to/from a rpout signal generator and a fpout signal generator that are included in a DDR synchronous memory device in accordance with the present invention.

As shown in FIG. 6, the rpout (fpout) signals 355-0~355-n (365-0~365-n) are generated from a rpout (fpout) signal generator 610 (620) based on a rpout_en (fpout_en) signal 552 (553) and the fclk (rclk) signal 542 (541) that is inputted to the rpout (fpout) signal generator 610 (620), respectively. Each rpout_en (fpout_en) signal 552 (553) that is generated from the data output control circuit 520 includes information of the cas latency and the burst length.

Figure 8:
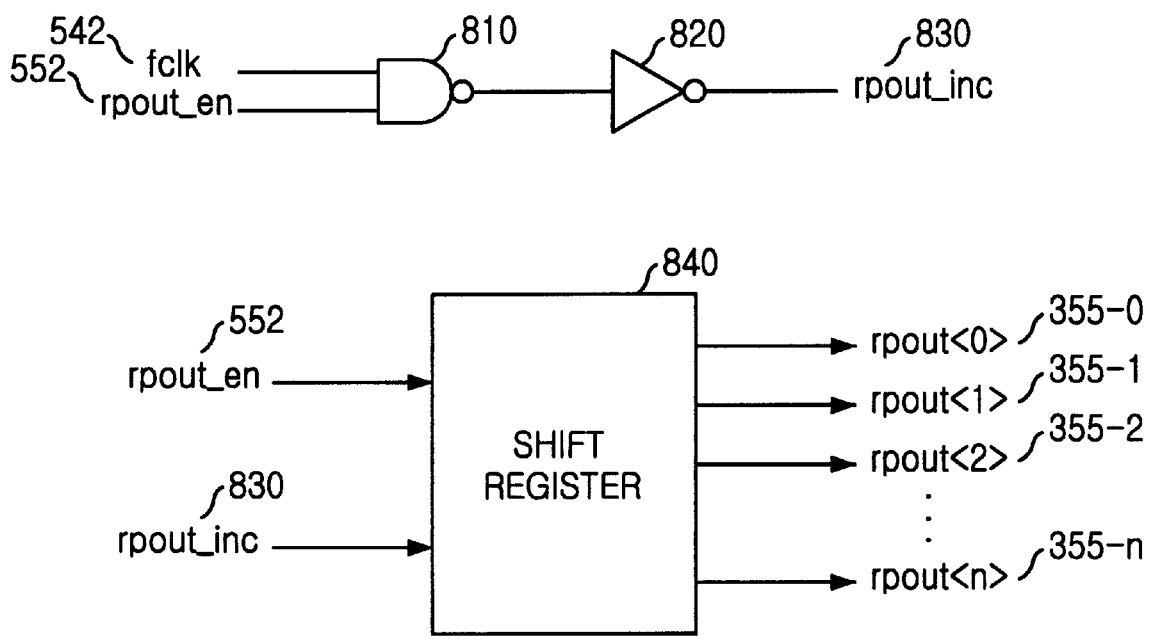
FIG. 8 is a circuit diagram showing a rpout signal generator included in a DDR synchronous memory device in accordance with the present invention.

FIG. 8 is a circuit diagram showing a rpout signal generator.

As shown in FIG. 8, the rpout signal generator includes a nand gate 810, an inverter 820 and a shift register 840. The nand gate 810 receives the fclk signal 542 and the rpout_en signal 552 and then generates an output signal. The output signal from the nand gate 810 is inputted to the inverter 820 and outputted as an inverted signal, a rpout_inc signal 830. Then, in response to the rpout_en signal 552, the rpout_inc signal 830 is inputted to the shift register 840 and the shift register 840 generates and outputs a plurality of rpout signals (rpout<0:n>) (rpout<0:n>=rpout<0> 355-0~rpout<n> 355-n).

Referring to FIG. 6, in the same way as the rpout signals 355-0~355-n are generated from the rpout signal generator 610, a plurality of fpout signals 365-0~365-n are generated from the fpout signal generator 620 based on the fpout_en signal 553 and the rclk signal 541 that are inputted to the fpout signal generator 620.

Figure 9:
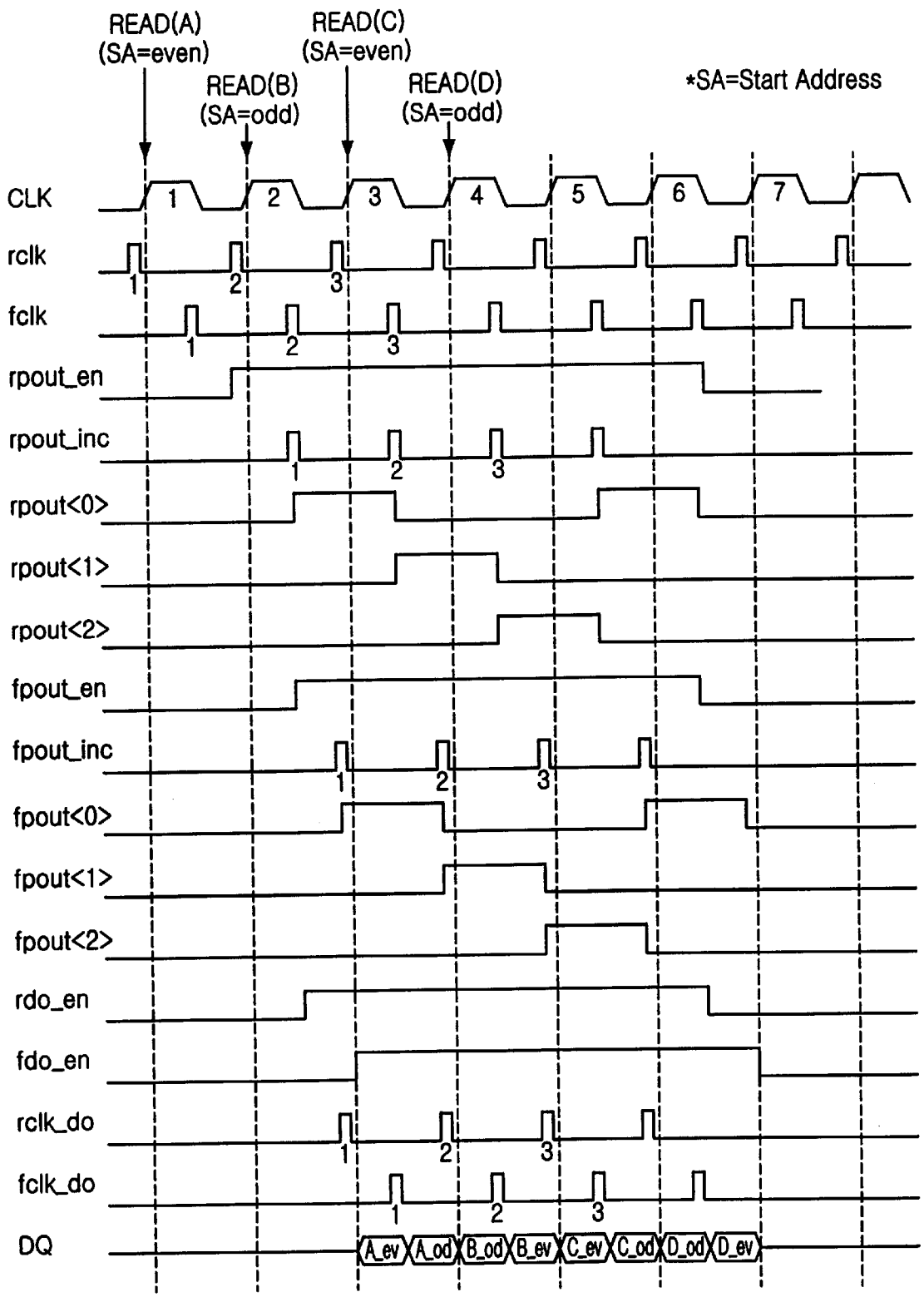
FIG. 9 is a timing chart illustrating data output in a DDR synchronous memory device in accordance with the present invention.

FIG. 9 is a timing chart illustrating data output in a DDR synchronous memory device wherein cas latency (CL)=2 and burst length=2.

The rclk signal is generated in synchronization with the rising edge of the external clock signal and the fclk signal is generated in synchronization with the falling edge of the external clock signal.

In response to the rpout_en signal, the rpout signals (rpout<0:n>) are generated based on the rpout_inc signal in synchronization with the fclk signal. In response to the fpout_en signal, the fpout signals (fpout<0:n>) are generated based on the fpout_inc signal in synchronization with the rclk signal.

In response to the rdo_en signal, the rclk_do signal is generated in synchronization with the rclk signal and immediately after the rclk_do signal is active, data latched by the rdo register are supplied via the output driver.

Also, in response to the fdo_en signal, the fclk_do signal is generated in synchronization with the fclk signal and immediately after the fclk_do signal is active, data latched by the fdo register are supplied via the output driver.

The data output device in accordance with the present invention can be applied to the DDR synchronous memory device operated at frequency higher than 200 MHz. Also, because a circuit configuration of the data output device is simple, quantity of power dissipation due to consecutive data outputs can be decreased.

Although the preferred embodiments of the invention have been disclosed for illustrative purpose, those skilled in the art will appreciate that various modifications, additions, and substitutions are possible, without departing from the scope and spirit of the invention as disclosed in the accompanying claims.

What is claimed is:

1. An apparatus for outputting data included in a synchronous memory device, the apparatus comprising:

first storage moans for storing in sequence even data provided by a first sense amplifier coupled to a selected even bank;

second storage means for storing in sequence odd data provided by a second sense amplifier coupled to a selected odd bank;

third storage means for storing data and for providing data in synchronization with a rising edge of a clock signal;

fourth storage means for storing data and for providing data in synchronization with a falling edge of the clock signal;

selection means coupled to the first storage means, the second storage means, the third storage means, and the fourth storage means; the selection means for receiving at substantially the same time even data from the first storage means and odd data from the second storage means and selectably driving the even data to one of the third storage means and the fourth storage means while driving the odd data to the other of the third storage means and the fourth storage means; and data output means for driving data from the third storage means and data from the fourth storage means to an output node.

2. The apparatus as recited in claim 1, wherein the first storage means includes:
   a plurality of even registers for receiving and storing in sequence the even data in response to a plurality of input control signals generated from a data output control circuit; and
   a first group of switching devices for switching operation in response to the plurality of input control signals, the first group of switching devices coupled between the first sense amplifier and the plurality of even registers.

3. The apparatus as recited in claim 2, wherein outputs of the data output control circuit include a first enable signal, a second enable signal, a third enable signal, a fourth enable signal, a first output control signal and a second output control signal.

4. The apparatus as recited in claim 1, wherein the second storage means includes:
   a plurality of odd registers for receiving and storing in sequence the odd data in response to a plurality of input control signals generated from a data output control circuit; and
   a second group of switching devices for switching operation in response to the plurality of input control signals, the second group of switching devices coupled between the second sense amplifier and the plurality of odd registers.

5. The apparatus as recited in claim 1, wherein the selection means includes:
   a putridity of multiplexing devices coupled to the first storage means and the second storage means, each multiplexing device including a first and a second switching devices responsive to a priority control signal generated by a first signal generating circuit and a third and a fourth switching devices responsive to an inverted priority control signal; and
   a plurality of storage units for storing the even data and the odd data supplied from the plurality of multiplexing devices and driving the even data and the odd data to the third storage means and the fourth storage means, each storage unit having a first buffer and a second buffer.

6. The apparatus as recited in claim 5, wherein input terminals of both the first and the fourth switching devices are coupled to an output terminal of the first storage means, input terminals of both the second and the third switching devices are coupled to an output terminal of the second storage means, output terminals of both the first aid the third switching devices coupled to each other are coupled to an input terminal of the first buffer and output terminals of both the second and the fourth switching devices coupled to each other are coupled to an input terminal of the second buffer.

7. The apparatus as recited in claim 1, wherein the third storage means includes:
   a third group of switching devices for switching operation and driving one of both the even data and the odd data in response to a plurality of first control signals generated by a second signal generating circuit including a first NAND gate, a first inverter and a first latching and switching circuit; and
   a first register for storing one of both the even data and the odd data.

8. The apparatus as recited in claim 1, wherein the fourth storage means includes:
   a fourth group of switching devices for switching operation and driving one of both the even data and the odd data in response to a plurality of second control signals generated by a third signal generating circuit including a second NAND gate, a second inverter and a second latching and switching circuit; and
   a second register for storing one of both the even data and the odd data.

9. The apparatus as recited in claim 1, wherein the data output means includes:
   a fifth switching device for switching operation and driving data from the third storage means in response to a first output control signal generated by a data output control circuit;
   a sixth switching device for switching operation and driving data from the fourth storage means in response to a second output control signal generated by the data output control circuit; and
   an output driver for supplying the even data and the odd data respectively from the third storage means and the fourth storage means or the even data and the odd data respectively from the fourth storage means and the third storage means to the output node.

10. The apparatus as recited in claim 2, wherein the plurality of input control signals are generated based on a first and a second internal clock signals generated from the data output control circuit, the first and the second internal clock signals being in synchronization respectively with a rising edge and a falling edge of the external clock signal.

11. The apparatus as recited in claim 5, wherein if a column address strobe latency associated with the synchronous memory device has a value equal to 2 and a starting address is in a logic low, the first and the second switching devices are operated.

12. The apparatus as recited in claim 5, wherein if a column address strobe latency associated with the synchronous memory device has a value equal to 2 and a starting address is in a logic high, the third and the fourth switching devices are operated.

13. The apparatus as recited in claim 5, wherein if a column address strobe latency associated with the synchronous memory device has a value equal to 2.5 and a starting address is in a logic low, the third and the fourth switching devices are operated.

14. The apparatus as recited in claim 5, wherein if a column address strobe latency associated with the synchronous memory device has a value equal to 2.5 and a starting address is in a logic high, the first and the second switching devices are operated.

15. The apparatus as recited in claim 7, wherein the first control signal is generated by NANDing a second internal clock signal inputted to the first NAND gate in response to a first enable signal, inverting an output of the first NAND gate via the first inverter and then latching and switching an output of the first inverter inputted into the first latching and switching circuit in response to the first enable signal.

16. The apparatus as recited in claim 8, wherein the second control signal is generated by NANDing a first internal clock signal inputted to the second NAND gate in response to a second enable signal, inverting an output of the second NAND gate via the second inverter and then latching and switching an output of the second inverter inputted to the second latching and switching circuit in response to the second enable signal.

17. The apparatus as recited in claim 9, wherein, in response to a third enable signal from the data output control circuit, the first output control signal is generated in synchronization with a first internal clock signal.

18. The apparatus as recited in claim 9, wherein, in response to a fourth enable signal from the data output control circuit, the second output control signal is generated in synchronization with a second internal clock signal.

19. The apparatus as recited in claim 9, wherein in case the even data is driven to the third storage means and the odd data is driven to the fourth storage means, the output driver supplies the even data in the rising edge and the odd data in the falling edge of an external clock signal during one cycle of the external clock signal prior to a next lead operation.

20. The apparatus as recited in claim 9, wherein in case the odd data is driven to the third storage means and the even data is driven to die fourth storage means, the output driver supplies the odd data in the rising edge and the even data in the falling edge of an external clock signal during one cycle of the external clock signal prior to a next read operation.

21. The apparatus as recited in claim 19, wherein the even data is supplied immediately after the first output control signal is high active and the odd data is supplied immediately after the second output control signal is high active.

22. The apparatus as recited in claim 20, wherein the odd data is supplied immediately after the first output control signal is high active and the even data is supplied immediately after the second output control signal is high active.

23. In a synchronous memory device, a circuit for outputting data from an even memory bank and an odd memory bank to an output node, the circuit comprising:
   an even data storage unit configured to sequentially store data output from the even memory bank;
   an odd data storage unit configured to sequentially store data output from the odd memory bank;
   a rising-edge register configured to output data to the output node in response to a rising edge of a clock signal;
   a falling-edge register configured to output data to the output node in response to a falling edge of the clock signal; and
   a switching system coupled between the even data storage unit, the odd data storage unit, the rising-edge register, and the falling-edge register, the switching system configured to receive a control signal and, in response to the control signal, to drive data from the even data storage unit to a selected one of the rising-edge register and the falling-edge register and to drive data from the odd data storage unit to the other of the rising-edge register and the falling-edge register.

24. The circuit of claim 25, further comprising a control signal generator coupled to the switching system, the control signal generator configured to generate the control signal in response to a starting column address, a column address strobe latency associated with the synchronous memory device, and the rising and falling edges of the clock signal.

25. The circuit of claim 23, wherein the even data storage unit comprises:
   a plurality of oven registers; and
   a corresponding plurality of even-register switch units, each even-register switch unit coupled between the even memory ban and a respective one of the plurality of even registers, the plurality of even-register switch units configured to direct data output from the even memory bank to one of the plurality of even registers in response to a plurality of pipe input signals.

26. The circuit of claim 25, wherein the odd data storage unit comprises:
   a plurality of odd registers; and
   a corresponding plurality of odd-register switch units, each odd-register switch unit coupled between the odd memory bank and a respective one of the plurality of odd registers, the plurality of odd-register switch units configured to direct output from the odd memory bank to one of the plurality of odd registers in response to the plurality of pipe input signals.

27. The circuit of claim 26, wherein the switching system comprises:
   a plurality of multiplexer units, each multiplexer unit coupled to a respective one of the even registers and a respective one of the odd registers;
   a corresponding plurality of rising-edge buffers, each rising-edge buffer coupled to a respective one of the multiplexers;
   a corresponding plurality of falling-edge buffers, each falling-edge buffer coupled to a respective one of the multiplexers;
   a corresponding plurality of rising-edge switch units, each rising-edge switch unit coupled between a respective one of the rising-edge buffers and the rising edge register and configured to direct data from the respective one of the rising-edge buffers to the rising-edge register in response to a plurality of rising-edge pipe output signals; and
   a corresponding plurality of falling-edge switch units, each falling-edge switch unit coupled between a respective one of the falling-edge buffers and the falling-edge register and configured to direct data from the respective one of the falling-edge buffers to the falling-edge register in response to a plurality of falling-edge pipe output signals.

28. The circuit of claim 27, wherein each multiplexer unit comprises:
   a first switching device configured to direct data from the respective one of the even registers to the respective one of the sing-edge buffers;
   a second switching device configured to direct data from the respective one of the odd registers to the respective one of the falling-edge buffers;
   a third switching device configured to direct data from the respective one of the even registers to the respective one of the falling-edge buffers; and
   a fourth switching device configured to direct data from the respective one of the odd registers to the respective one of the rising-edge buffers;
      wherein the first and second switching devices are active in response to a first state of the control signal, and the third and fourth switching devices are active in response to a second state of the control signal.

* * * * *